United States Patent [19]

Hagino

[11] Patent Number: 4,556,898

[45] Date of Patent: Dec. 3, 1985

[54] SEMICONDUCTOR DEVICE

[75] Inventor: Hiroyasu Hagino, Itami, Japan

[73] Assignee: Mitsubishi Denki Kabushiki Kaisha, Tokyo, Japan

[21] Appl. No.: 565,740

[22] Filed: Dec. 27, 1983

[30] Foreign Application Priority Data

Jan. 20, 1983 [JP] Japan .................................. 58-9129

[51] Int. Cl.⁴ ..................... H01L 23/48; H01L 29/46; H01L 29/54; H01L 29/62
[52] U.S. Cl. ........................................ 357/71; 357/65; 29/591; 29/882
[58] Field of Search ............... 357/65, 71 R; 29/81 R, 29/25.14, 25.17, 25.18, 591, 827, 844, 876, 882

[56] References Cited

U.S. PATENT DOCUMENTS 4,394,678 7/1983 Winchell et al. .................... 357/71

Primary Examiner—William L. Sikes
Assistant Examiner—Robert E. Wise
Attorney, Agent, or Firm—Lowe, King, Price & Becker

[57] ABSTRACT

A semiconductor device includes a semiconductor element (21) having a cathode (21d) divided into a plurality of islands, each of the cathode islands (21d) being electrically connected through a cathode insert (24). The cathode insert (24) comprises a cup-shaped first conductor (241, 245) and a second conductor (242, 246) fitted into and kept in electrical contact with the first conductor (241, 245). The cup-shaped first conductor (241, 245) is disposed such that its bottom is in electrical contact with the plurality of the cathode islands (21d). The cathode side of the semiconductor element (21) is pressed against the anode side thereof for good liberation of heat.

14 Claims, 9 Drawing Figures

FIG.3(c) 242 / $W_1$ / $W_2$ / A / 241 / A / 24

SEMICONDUCTOR DEVICE

BACKGROUND OF THE INVENTION

1. Field of the Invention

This invention relates to a semiconductor device, and more particularly to a semiconductor device wherein a cathode is divided into a plurality of discrete islands connected together through a plate and the cathode side thereof is pressed against the anode side thereof.

2. Description of the Prior Art

It is generally known in the field of high power semiconductor devices especially high power gate turn-off thyristors (GTO) that the cathode side of the element is pressed against the anode side thereof (pressure method). Conventionally, as is illustrated in FIG. 1, a structure in high power GTO's suitable for turning off large current is adapted such that a plurality of cathode emitters are formed in the form of islands, each of which is environed with gate electrode.

A semiconductor element 11 in FIG. 1 is a GTO and has a P-N-P-N four layer structure. A P type layer 11a represents an anode emitter region, an N type layer 11b an anode base region, a P type layer 11c a cathode base region and an N type region 11d a cathode emitter region. An anode electrode 10 is disposed on the anode emitter region 11a and is in electrical connection with the same. The anode electrode 10 generally comprises an alloy of a metal having a coefficient of thermal expansion hardly different from that of silicon (Si), for example, molybdenum (Mo). The cathode emitter region 11d includes many discrete islands on which cathode electrodes 12 are mounted so as to come into electrical contact with these islands. Disposed over the cathode base region 11c around the islands of the respective cathode emitter regions 11d are electrodes 13 which are held in electrical connection with the cathode base regions. The respective cathode electrodes 12 are electrically coupled to each other by intervention of a cathode insert 14 which is made up by a highly thermally and electrically conductive metal material such as molybdenum (Mo). In order that the respective gate electrodes 13 surrounding the cathode emitter regions 11d may not come into contact with the cathode insert 14 during the pressing of the element, the cathode base regions are dimpled by chemical etching or other well known methods. The cathode insert 14 is fixed to the GTO element 11 through the use of silicon rubber 18 or other conventional materials, no to move itself during assembly. Two electrode blocks 16 and 17 are disposed on the anode electrode 10 and the cathode insert 14 so as to come into electrical connection with the same, respectively. These electrode blocks 16 and 17 are made up by a material which is very high in thermal conductivity and has good affinity for the cathode insert 14 typically of copper (Cu), for example, molybdenum (Mo). By pressing the two electrodes blocks 16 and 17 to each other in the direction of the arrow, the GTO element with satisfactory heat radiation is attained.

As is well known in the art, the above described structure of the semiconductor device is suitable for high power applications because the anode and cathode electrode blocks 16 and 17 are highly effective in radiating heat. A particular problem with the above structure of the semiconductor device lies in the interfacial condition of the cathode insert 14 between the electrode block 17 and the cathode electrodes 12.

The cathode insert 14 is generally processed by etching, cutting, patching and otherwise. In this instance, a burr is necessarily brought at edge portions of the cathode insert 14. This burr is the main cause of short-circuit with the gate electrode during the pressing of the semiconductor device. One way to overcome the problem is to process the cathode insert 14 so as to remove such burrs. This approach however produces another difficulty from the viewpoint of process administration.

SUMMARY OF THE INVENTION

This invention is directed to a semiconductor device wherein a cathode is divided into a plurality of discrete islands connected to each other through a plate and the anode side thereof is pressed against with the cathode side thereof.

According to the present invention, there is provided a semiconductor device which comprises a semiconductor element having at least a cathode and an anode; the cathode being divided into a plurality of island; and a cathode insert comprising a cup-shaped first conductor and a second conductor fitted into and kept in electrical contact with the first conductor; the bottom of the cup-shaped first conductor being held in electrically connecting relationship with the first conductor, wherein the cathode side thereof is pressed against the anode side thereof.

Accordingly, it is the primary object of the present invention to provide a semiconductor device which is free of the problem of short-circuit as caused by a burr at an edge portion of a cathode insert during the pressing of the device.

These objects and other objects, features aspects and advantages of the present invention will become more apparent from the following detailed description of the present invention when taken in conjunction with the accompanying drawings.

BRIEF DESCRIPTION OF THE DRAWINGS

FIGS. 3A, 3B and 3C are a cross sectional view showing a cup-shaped first conductor and a second conductor fitted into the first conductor, for use in the semiconductor device according to the present invention;

FIG. 5 is a cross sectional view showing a high power semiconductor device of a pressure type according to another preferred embodiment of the present invention; and FIGS. 6A and 6B are a cross sectional view showing a cup-shaped first conductor and a second conductor fitted into the first conductor, for use in the semiconductor device according to another preferred embodiment of the present invention.

DESCRIPTION OF PREFERRED EMBODIMENTS

Figure 1:
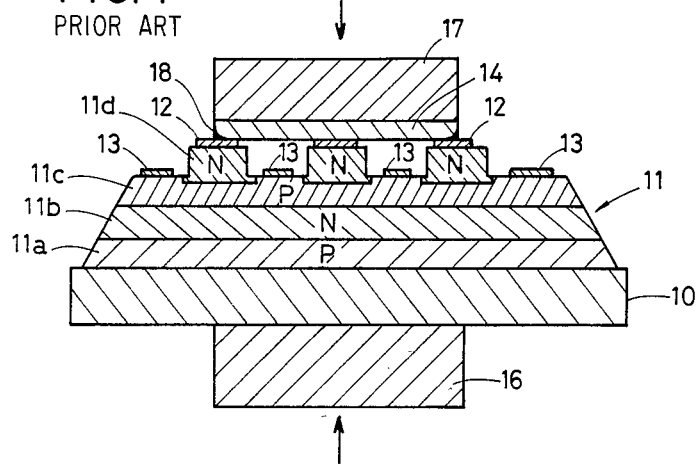
FIG. 1 is a cross sectional view of a conventional high power semiconductor device of a pressure type.
Figure 2:
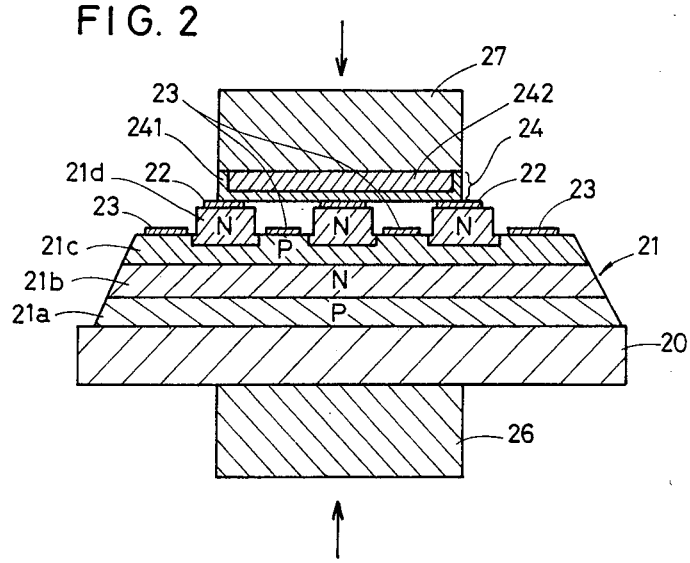
FIG. 2 is a cross sectional view of a high power semiconductor device of a pressure type according to a preferred embodiment of the present invention.

In FIG. 2, there is illustrated a cross sectional view of a semiconductor device according to a preferred embodiment of the present invention. Likewise the conventional device, the illustrated semiconductor device includes a gate turn-off tyristor (GTO) element 21 of a P-N-P-N four layer structure. In this structure, a P type layer 21a represents an anode emitter region, an N type layer 21b an anode base region, a P type layer 21c a cathode base region and an N type layer 21d a cathode emitter region.

Over the anode emitter region 21a there is disposed an anode electrode 20 which is made up by an alloy of a metal having a coefficient of thermal expansion different from that of silicon (Si), for example, molybdenum (Mo) and maintained in electrically connecting relationship with that region. The N type cathode emitter region 21d is divided into three discrete islands on which the cathode electrodes 22 are mounted in electrical connection with those regions. There are further provided gate electrodes 23 which surround the cathode emitter regions 21d and are kept in electrically connecting relationship with surfaces of the cathode base regions 21c.

Each of the cathode electrodes 22 comprises a cup-shaped first conductor 241 and a second conductor 242 fitted into and kept in electrical contact with the first conductor. All of the cathode electrodes are electrically connected to each other by intervention of a cathode insert 24. Mounted on the cathode insert 24 overlying the cathode electrodes 22 is a first electrode block 27 which is kept in electrically connecting relationship with the cathode insert 24. A second electrode block 26 is disposed on the anode electrodes 20 and electrically connected with the same. For good radiation of heat, the first and second electrode blocks 27 and 26 provided on the cathode and anode sides are typically made of copper (Cu). A high power GTO element with satisfactory heat radiation is eventually attained by pressing the two blocks 26 and 27 to each other in the direction of the arrow.

Figure 4:
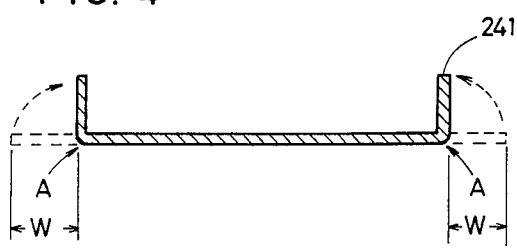
FIG. 4 is a cross sectional view showing the cup-shaped first conductor used in the semiconductor device according to the present invention as well as the method for making the same.
Figures 3A, 3B, 5, 6A, 6B:
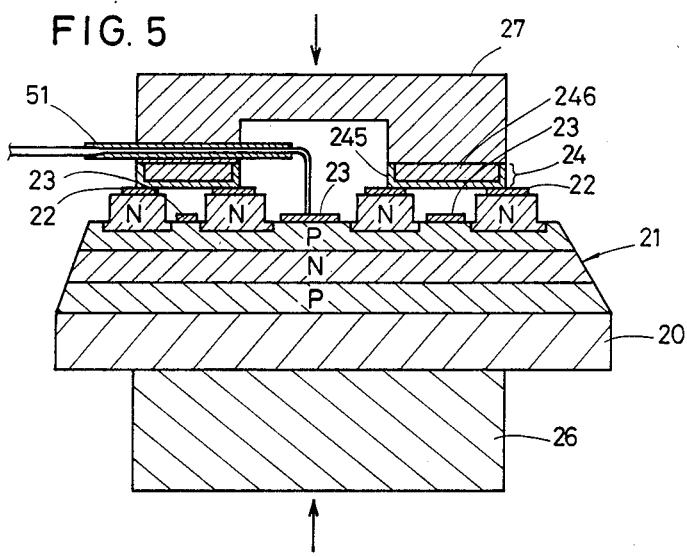

FIG. 3 is a cross sectional view of the cathode insert 24 is shown in FIG. 2. It is clear from FIG. 3(a) that the cup-shaped first conductor 241 of the cathode insert 24 is provided by bending a relatively thin plate. FIG. 4 shows one way by which a conductive plate is bent in a vertical direction at a portion appropriately apart from its peripheral edge to form the cup shape of the first conductor 241.

As is seen from FIG. 3(b), the second conductor 242 of the cathode insert 24 is a relatively thick conductor plate or a plank. This relatively thick second conductor 242 is fitted into the cup-shaped first conductor 241 in order to provide reinforcement for the first conductor 241.

Generally, a proper material for the cup-shaped first conductor 241 is molybdenum (Mo). The thickness of molybdenum which permits bending in simple manner is 200 μm or less. Therefore, the thickness of the first conductor 241 must be 200 μm or less. In the event that the first conductor 241 of a thickness ranging from 100 to 200 μm is used, the first conductor 241 is in the danger of being distorted during the pressing of the element, which distortion may result in short-circuit. To back up physically the first conductor 241 typically of molybdenum, it is desirable that the relatively thick second conductor 242 be inserted into the first conductor. Likewise the first conductor 241, the second conductor 242 is preferably made of molybdenum (Mo). The thickness of the second conductor 242 of molybdenum is preferably 500 μm or more. It does not matter whether some burrs are present at edge portions of the second conductor 242, because it is fitted into the cup-shaped first conductor 241.

The bending width W of the first conductor 241 may be wider ($W_1$) of narrower ($W_2$) than the thickness (say, 1 mm) of the relatively thick second conductor 242 fitted thereinto. When the bending width W is $W_2$ or when it is narrower than the thickness of the second conductor 242, it is necessary to fix the first conductor 241 in place, using silicon rubber or other well-known materials, as in the conventional device. However, when the bending width W is $W_1$ or wider than the thickness of the second conductor 242, a portion of the first electrode block 27 may be fitted into the second conductor 242. In this connection, the latter method is more desirable from the viewpoint of manufacturing technique.

As stated previously, the cup-shaped first conductor 241 of the cathode insert 24 is completed by bending, such that the bending portion is rounded out and free from burrs. The semiconductor device according to the present invention has no problem of short-circuit during the pressing of the device as experienced with the conventional device, because the respective cathode electrodes 22 are electrically connected through such burr-free cup-shaped first conductor 241.

FIG. 5 is a cross sectional view of a semiconductor device according to another preferred embodiment of the present invention. In the device of FIG. 5, lead-out structures for the gate electrodes 23 are provided at the center of the GTO element. In FIG. 5, components similar to those in FIG. 2 are identified by the same reference numbers, with the detailed descriptions thereof being omitted herein. The gate electrodes 23 at the center of the GTO element 21 are led to the exterior of the device through output leads 51. In the illustrated structure, the central portion of the GTO element 21 may be shaped into a circular form with an appropriate diameter (other forms including a hexagon and a square may also be applicable). In this case, a cup-shaped first conductor 245 need be bent and worked in conformity with that form, as best shown in FIG. 6(a). Furthermore it is necessary to work a relatively thick second conductor 246 in such a manner as to be fitted into the first conductor 245.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device with improvements for avoiding a short circuit between a machined cathode contact of said device, wherein said contact may have burrs on its edges, and any element of said semiconductor device other than its cathode, wherein the semiconductor device comprises at least said cathode and an anode, the cathode being divided into a plurality of islands, and wherein the cathode contact comprises a first machined first conductor, which may have burrs on its edges, that has all its edges bent upwards so that the first conductor is cup-shaped, and a second conductor disposed in the cup of the first conductor and in electrical contact with it, wherein the bottom of the cupped first conductor contacts the cathode of semiconductor device.

2. A semiconductor device in accordance with claim 1 wherein said semiconductor device has a PNPN four layer structure.

3. A semiconductor device in accordance with claim 2 wherein said semiconductor element is a gate turn-off thyristor.

4. A semiconductor device in accordance with claim 3 further comprising:
a pair of electrode blocks for pressing the cathode side of said semiconductor device against the anode side of said semiconductor device, said pair including a first electrode block disposed on and kept in electrical contact with said cathode and a second electrode block disposed on and kept in electrical contact with said anode.

5. A semiconductor device in accordance with claim 4 wherein the depth of said cup-shaped first conductor is greater than the thickness of said second conductor so that at least a portion of said first electrode block is fixedly fitted into said cup-shaped first conductor.

6. A semiconductor device in accordance with claim 4 wherein said first and second conductors are made of molybdenum.

7. A semiconductor device in accordance with claim 6 wherein said first conductor is relatively thin and said second conductor is relatively thick.

8. A semiconductor device is accordance with claim 7 wherein the thickness of said cup-shaped first conductor is 200 $\mu$m or less and the thickness of said second conductor is 500 $\mu$m or more.

9. A semiconductor device comprising:
a semiconductor element having a PNPN four layer structure of a stack of an anode emitter region, an anode base region, a cathode base region and a cathode emitter region in that order, said cathode emitter region being divided into a plurality of islands with surfaces of said respective islands protruding from a surface of said cathode base region;
an anode electrode held in electrical connection with a surface of said anode emitter region of the semiconductor element;
gate electrodes held in electrical connection with the surface of said cathode base region of said semiconductor element while surrounding said respective islands;
cathode electrodes held in electrical connection with surfaces of the respective islands of said semiconductor element;
and wherein the cathode contact comprises a first machined first conductor, which may have burrs on its edges, that has all its edges bent upwards so that the first conductor is cup-shaped, and a second conductor disposed in the cup of the first conductor and in electrical contact with it, wherein the bottom of the cupped first conductor contacts the cathode of said semiconductor device;
a first electrode block held in electrical contact with a surface of said cathode; and
a second electrode block held in electrical contact with a surface of said anode electrode for sandwiching under pressure said semiconductor element and said cathode between said first and second electrode blocks.

10. A semiconductor device in accordance with claim 9 wherein said semiconductor element is a gate turn-off thyristor.

11. A semiconductor device in accordance with claim 9 wherein the height of said side portions of said first conductor is greater than the thickness of said second conductor so that at least a portion of said first electrode block is fixedly fitted into said first conductor.

12. A semiconductor device in accordance with claim 9 wherein said first and second conductors are made of molybdenum.

13. A semiconductor device in accordance with claim 9 wherein said first and second conductors have a circular form, respectively.

14. A semiconductor device in accordance with claim 9 wherein said first and second conductors have a doughnut form, respectively.

* * * * *